United States Patent
Wang

(10) Patent No.: US 7,272,370 B2
(45) Date of Patent: Sep. 18, 2007

(54) MIXERS WITH A PLURALITY OF LOCAL OSCILLATORS AND SYSTEMS BASED THEREON

(75) Inventor: Zhenhua Wang, Zürich (CH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/523,667

(22) PCT Filed: Aug. 5, 2003

(86) PCT No.: PCT/IB03/03138

§ 371 (c)(1), (2), (4) Date: Feb. 4, 2005

(87) PCT Pub. No.: WO2004/015439

PCT Pub. Date: Feb. 19, 2004

(65) Prior Publication Data

US 2006/0040634 A1   Feb. 23, 2006

(30) Foreign Application Priority Data

Aug. 8, 2002 (EP) .................... 02017848

(51) Int. Cl.
- *H04B 1/16* (2006.01)
- *H04B 1/18* (2006.01)
- *H04B 1/26* (2006.01)

(52) U.S. Cl. ............... 455/209; 455/313; 455/293
(58) Field of Classification Search ........... 455/313, 455/314, 315, 209, 293, 141, 146, 206, 189.1; 331/2, 23, 40, 74, 1
See application file for complete search history.

(56) References Cited

U.S. PATENT DOCUMENTS

| | | | | |
|---|---|---|---|---|
| 5,220,683 A * | 6/1993 | Rudish | ............. | 455/313 |
| 6,094,569 A * | 7/2000 | Wang | ............. | 455/313 |
| 6,397,051 B1 * | 5/2002 | Abbasi et al. | ............. | 455/313 |
| 6,728,525 B1 * | 4/2004 | Leizerovich et al. | ........ | 455/293 |
| 6,728,528 B1 * | 4/2004 | Loke | ............. | 455/313 |
| 6,920,185 B2 * | 7/2005 | Hinson | ............. | 375/295 |
| 6,960,962 B2 * | 11/2005 | Peterzell et al. | ............. | 331/40 |
| 6,993,295 B2 * | 1/2006 | Gilmore | ............. | 455/76 |
| 2006/0040634 A1 * | 2/2006 | Wang | ............. | 455/313 |

FOREIGN PATENT DOCUMENTS

| EP | 0322024 A2 | 6/1989 |
|---|---|---|
| EP | 0322024 A3 | 6/1989 |

* cited by examiner

*Primary Examiner*—Aung Moe

(57) ABSTRACT

A receiver apparatus including a main input for receiving the input signal and a first standard mixer having a first mixer input, a first local oscillator input, and a first mixer output. The first mixer input is connected to the main input and the first local oscillator input is connected to a source that provides a first local oscillator signal having a frequency close to or equal to the carrier frequency. The apparatus further including a second mixer with a second mixer input, a second local oscillator input, and a second mixer output. The second mixer input is connected to the main input and the second local oscillator input is connected to a source that provides a second local oscillator signal with an undesired sideband frequency. There are circuit for super-positioning the first output signal and the second output signal. The first local oscillator signal and the second local oscillator signal are square-wave signals.

24 Claims, 4 Drawing Sheets

MIXERS WITH A PLURALITY OF LOCAL OSCILLATORS AND SYSTEMS BASED THEREON

The present invention relates to mixers with local oscillators (LO) and systems based thereon. More particularly, this invention relates to spurious-reject mixers well-suited for use in receivers, in particular for radio-frequency signal receivers. The invention also pertains to quadrature mixers.

Mixers are key elements and critical building blocks indispensable in almost all communication systems such as Global System for Mobile communication (GSM) systems, Bluetooth systems, and Universal Mobile Telephony Systems (UMTS), for example. The mixers are used to carry out frequency translation of the transmitted signal (herein referred to as information signal). This frequency translation is performed by multiplying two signals, and possibly their harmonics.

In the receiver path 10 of a conventional receiver, for example, down conversion mixers are used that have two distinctly different paths, as illustrated in FIG. 1: a radio-frequency (RF) port 11 and a local oscillator (LO) port 12. The mixer 13 multiplies the two signals applied to the ports 11 and 12. A low-pass filter (LPF) 14 on the output side of the mixer 13 filters the signal after the multiplication. In FIG. 2A, RF signals are shown that have a first band (referred to as desired signal or desired band) where an information signal is carried by a carrier signal with frequency $\omega_{RF}$. In addition to this first band there are two other spurious bands (also referred to as spurious bands or sidebands) at higher frequencies. The spectrum of the LO signal that is applied to the port 12 is illustrated in FIG. 2B. This signal is tuned to the carrier frequency $\omega_{RF}$ of the desired RF signal. At the same time, the LO signal has higher-order harmonics. In FIG. 2B, the $3^{rd}$ order and $5^{th}$ order harmonics of the LO signal are depicted. On the output side of the filter 14, the intermediate-frequency (IF) signal comprises the desired signal plus the signals of the spurious bands. In FIG. 2C this is illustrated in that the signals of the three bands overlap around zero. In such a case, it is impossible for the receiver to discriminate information carried by the desired signal from information carried by the spurious bands.

Mixers can be either passive or active. Passive mixers are simpler, achieve higher linearity and speed, but do not provide any gain. In contrast, active mixers provide considerable gain, so that the noise contribution by the subsequent stages can be reduced. For these reasons, passive mixers find application in microwave and base station circuits, while active mixers are widely used in RF systems.

The LO signal of practical mixers, no matter what type they are, is a square-wave signal. Controlled by an LO signal of a square wave, the output A of a passive mixer is equal to the RF input when the transistor switch in the mixer is on, and the output A is zero when this switch is off. Therefore, the operation of passive mixers can be viewed as a multiplication of the RF signal at port 11 by a rectangular waveform at port 12.

Active mixers, such as a Gibert cell, utilize a switching transistor pair (e.g. MOS transistors) for current commutation, where a transconductance stage is used to convert the input voltage signal at the RF port 11 to a current, which is then commutated by the switching transistor pair, controlled by the LO signal at the LO port 12. In order to minimize the circuit noise and achieve the best noise figure it is desirable to have a square-wave LO signal with 50% duty cycle to turn the switch as abruptly as possible on and off.

In most treatments, the mixing operation is considered just a multiplication of the RF input by a sinusoidal LO signal. Under this simplification, the output spectrum of the mixer contains only two second-order products: the difference $\omega_{RF}-\omega_{LO}$ and the sum $\omega_{RF}+\omega_{LO}$. In receivers, the former is the desired IF frequency, $\omega_{IF}$, while the latter is rejected by a bandpass filter or lowpass filter 14 (LPF) following the mixer 13. As will be shown next, such a treatment is too simple and rough to improve the performance of existing mixers.

Details about mixers are given in the book entitled "RF Microelectronics", by Behzad Razavi, Prentice Hall, 1998 (ISBN 0-13-887571-5), for example. But there are many other publications about mixers.

Because the LO signal of mixers is a square-wave and not a sine-wave signal, a square wave rather than sine wave has to be used for analysis and design. When a square wave signal is applied to the LO port 12 of a mixer 13, various cross products of the RF and LO signals will be produced at the mixer output A due to the harmonics of the LO signal. Generally, the RF input contains, even after some filtering, not only the desired signal band, but also other unwanted signals, or spurious signals. Mostly, the spurious signals stem from other communication networks or other sources, but it could be possible that they come from the same communication network. This happens if the ratio $\xi=\omega_{CBW}/\omega_{LO}$ is not very small, where $\omega_{CBW}$ is the channel bandwidth. It can be shown that if $\xi=2$ one has the worst scenario in which the neighboring channels become spurious because they are exactly at the odd harmonics of the LO, i.e., 3 $\omega_{LO}$, 5 $\omega_{LO}$, . . . After mixing, these spurious signals are converted, similar to the desired signal, down to the IF band (cf. FIG. 2C), thereby corrupting or even overwhelming the desired signal. This is the reason why the spurious response remains an obstacle to improvement, even for today's mixers.

It is thus an object of the present invention to improve current mixers and receivers based thereon.

This obstacle described above is removed with the invention of the spurious-reject mixers described and claimed herein.

A mixer in accordance with the present invention is claimed in claim 1.

Various advantageous embodiments are claimed in claims 2 through 11.

A method in accordance with the present invention is claimed in claim 12.

Various advantageous methods are claimed in claims 13 through 22.

A mixer according to the present invention is particularly well-suited for use in a receiver. A receiver in accordance with the present invention is claimed in claim 23.

An advantageous receiver embodiment is claimed in claim 24.

Immediate benefits from this invention are significantly better performance, much lower cost, strong competitiveness, etc.

Other advantages of the present invention are addressed in connection with the detailed embodiments.

For a more complete description of the present invention and for further objects and advantages thereof, reference is made to the following description, taken in conjunction with the accompanying drawings, in which.

The present invention is based on the following principle. The mixers according to the present invention explore the existing cross products of the harmonics of the LO square-wave signal in standard mixers, and generate exactly these products for cancellation. In order to avoid "direct feedthrough", the output of the mixer is sensed as a differential signal, i.e. a signal that is symmetrical with respect to 0. Therefore, the square-wave LO toggles between −1 and +1, as shown in FIG. 3.

Figure 3:
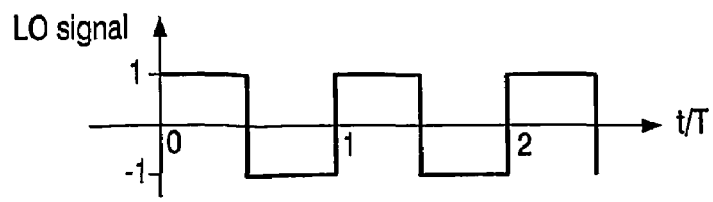
FIG. 3 is a diagram depicting a square-wave LO signal, as used in connection with mixers according to the present invention.

The Fourier series of the waveform of FIG. 3 is given by:

$$S_{LO}(t) = \frac{4}{\pi}\left(\sin\omega_{LO}t + \frac{1}{3}\sin 3\omega_{LO}t + \frac{1}{5}\sin 5\omega_{LO}t + ...\right) \quad (1)$$

where $\omega_{LO}=2\pi/T$, and T is the period of the square wave. In equation (1), a 50% duty cycle is assumed. For the spurious-reject mixers according to the present invention it is important to note that the amplitude of the n-th harmonic of the LO signal is n times smaller than the amplitude of the fundamental, as indicated by equation (1). For the sake of simplicity, first the RF input is expressed as $S_{RF}(t)$. After the multiplication, the result at point A of the mixer is given by $$S_A(t) = \frac{4}{\pi}S_{RF}(t)\left(\sin\omega_{LO}t + \frac{1}{3}\sin 3\omega_{LO}t + \frac{1}{5}\sin 5\omega_{LO}t + ...\right) \quad (2)$$

Now a situation is considered in where the RF input is:

$$S_{RF}(t) = A\sin(\omega_{LO}t+\theta_A) + B\sin(3\omega_{LO}t+\theta_B) + C\sin(5\omega_{LO}t+\theta_C) + \quad (3)$$

Figure 2A:
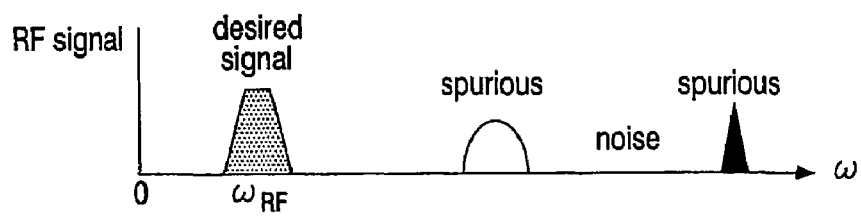
FIG. 2A is a diagram depicting a typical RF signal with two spurious signals.
Figure 2B:
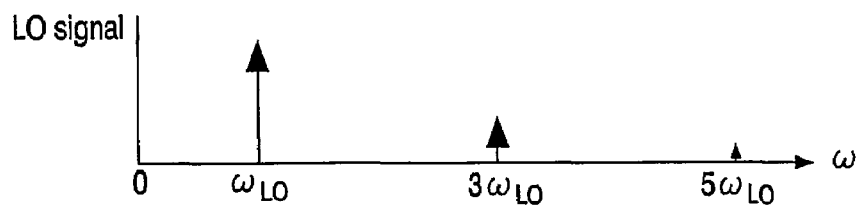
FIG. 2B is a diagram depicting the LO frequency and its harmonics.
Figure 2C:
FIG. 2C is a diagram depicting the corruption of the signals of the three bands after down-conversion (zero IF assumed).

The first term is the desired signal at carrier frequency $\omega_{LO}$, and the second and the third terms are two spurious signals at frequencies $3\omega_{LO}$ and $5\omega_{LO}$, respectively. After mixing, the signal at point A of the mixer is:

$$S_A(t) = \frac{2}{\pi}\left(A\cos\theta_A + \frac{B}{3}\cos\theta_B + \frac{C}{5}\cos\theta_C + ...\right) + HFT \quad (4)$$

where HFT stands for high-frequency terms, which can be rejected by the low-pass filter following the mixer. After filtering, the first term in parenthesese is the down-converted signal, while the second and third terms are the spurious responses due to the third and fifth harmonics of the LO signal. In the frequency domain, these two unwanted terms would fall in the IF band (zero frequency in FIG. 2C), thereby reducing the signal-to-noise (S/n) ratio of the receiver and worsening the bit error rate, since bits transmitted in the desired band cannot be distinguished from bits transmitted in the other bands. Although, there will be some kind of filtering to attenuate these spurious signals, before they enter the mixer, unfortunately, any realistic filter can only provide finite attenuation to these spurious signals. Because of the lack of knowledge about these spurious signals, i.e., B, $\xi_B$, C, $\xi_C$, and so on, no remedy or solution has been available so far, and the spurious response in a mixer has long been an obstacle to the effort to improve the existing mixers. Due to the finite transit band of a filter, in general the spurious signals around the third and fifth harmonics of the LO signal are the most troublesome ones, and they might even be larger than the desired signal at the mixer input, even after the filtering.

This is the motivation of the invention to be described and claimed herein. With the new, inventive mixers, the troublesome terms can be eliminated completely from the mixer output. For the sake of simplicity, yet without loss of generality, the inventive spurious-reject mixer will be disclosed with two embodiments that eliminate the second and third terms in parenthesese of the equation (4).

Note that the method described in these embodiments can be extended to eliminate other remaining and smaller terms, but the complexity will increase as more unwanted intermodulation products are to be eliminated.

Figure 4A:
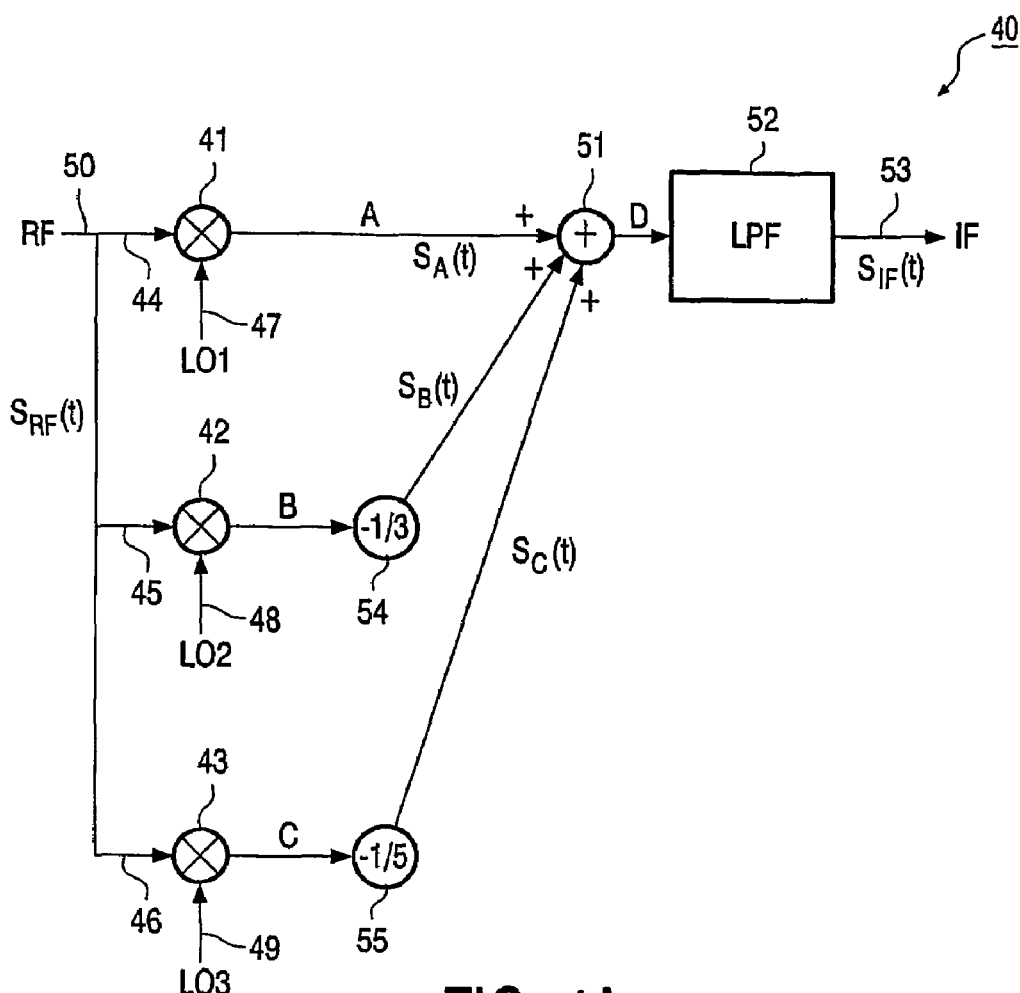
FIG. 4A is a schematic block diagram depicting a first spurious-reject mixer according to the present invention.
Figure 4B:
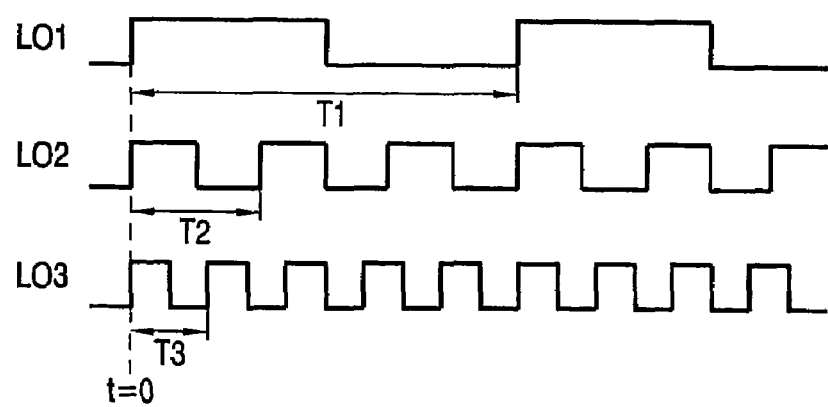
FIG. 4B is a diagram depicting three square-wave LO signals, as used in connection with a mixer of FIG. 4A.

In FIG. 4A, a first spurious-reject mixer 40 according to the present invention is shown. The mixer 40 comprises three standard mixers 41, 42, and 43 in this example. In general, a total of n standard mixers are required if the first n−1 unwanted terms in parenthesese of the equation (4) are to be eliminated. An RF signal $S_{RF}(t)$ is applied to the RF ports 44, 45, and 46 of all three standard mixers 41, 42, and 43, while the LO signals for each standard mixer 41, 42, and 43 are different. In other words, all standard mixers of the mixer 40 have one common input 50. The LO signals are LO1, LO2, and LO3, respectively. The signal LO1 is applied to the port 47, the signal LO2 is applied to the port 48, and the signal LO3 is applied to the port 49. That is, each standard mixer 41, 42, 43 has an individual LO port 47, 48, 49, respectively. Denoting the periods of the signals LO1, LO2 and LO3 by T1, T2 and T3 (cf. FIG. 4B), these signals must have the following relationship:

$$T2 = T\frac{1}{3}$$

$$T3 = T\frac{1}{5} \quad (5)$$

and they must have zero phase at t=0 as well, as shown in FIG. 4B. This makes sure that the frequency of the signal LO2 is three times, and the frequency of the signal LO3 is five times the frequency of the signal LO1, in order to enable a simple realization.

According to the present invention, all LO signals are square-wave signals. Now, equations (2) and (4) are still valid for the upper standard mixer 41 in FIG. 4A. The results of the other two standard mixers 42 and 43 at points B and C, respectively, can be written similarly as:

$$S_B(t) = \frac{4}{\pi}S_{RF}(t)\left(\sin3\omega_{LO}t + \frac{1}{3}\sin9\omega_{LO}t + \frac{1}{5}\sin15\omega_{LO}t + \ldots\right) \quad (6)$$

$$S_C(t) = \frac{4}{\pi}S_{RF}(t)\left(\sin5\omega_{LO}t + \frac{1}{3}\sin15\omega_{LO}t + \frac{1}{5}\sin25\omega_{LO}t + \ldots\right)$$

Again, the RF input is given by the equation (3). Substitution in above equations by the equation (3) yields:

$$S_B(t) = \frac{2}{\pi}B\cos\vartheta_B + HFT \quad (7)$$

$$S_C(t) = \frac{2}{\pi}C\cos\vartheta_C + HFT$$

Now, if the output signal $S_B(t)$ of the standard mixer 42 in the middle is attenuated by a factor 3, and the output signal $S_C(t)$ of the lower standard mixer 43 by a factor 5, and if the output signals $S_B(t)$ and $S_C(t)$ are then subtracted from the output signal $S_A(t)$ of the upper standard mixer 41, the result $S_D(t)$ at point D becomes:

$$S_D(t) = \frac{2}{\pi}B\cos\omega\vartheta_A + HFT \quad (8)$$

The subtraction is carried out by an adder 51, the output signals $S_B(t)$ and $S_C(t)$ having a negative sign. It is seen that the second and third terms, $2B \cos \theta_B/(3\pi)$ and $2C \cos \theta_C/(5\pi)$, which are present in the output signal $S_A(t)$ of the upper standard mixer 41 at point A (equation (4)), disappear completely from the output signal $S_D(t)$ of the new mixer 40 at point D, i.e. they are fully eliminated or rejected. All higher frequency terms (HFTs) can be suppressed by a subsequent low-pass filter 52, leaving only the desired signal at the mixer output 53:

$$S_{IF}(t) = \frac{2A}{\pi}\cos\vartheta_A \quad (9)$$

It is thus proven that the new mixer 40, as depicted in FIG. 4A, completely rejects spuriousness and thus is indeed a spurious-reject mixer.

A mixer in accordance with the first embodiment can be used in cellular telephone technology for heterodyning an incoming radio-frequency (RF) cellular telephone signal down to an intermediate frequency, for example.

Another mixer, according to the present invention, just has a second mixer in addition to a first mixer, since this mixer is designed to eliminate the $3^{rd}$ order harmonic only. The mixer is designed to process an input signal $S_{RF}(t)$ having a carrier frequency ($\omega_{RF}$) defining a desired band and a side-band that falls into the $3^{rd}$ harmonic of a first local oscillator signal LO1. The mixer comprises a main input for receiving the input signal $S_{RF}(t)$, and a first standard mixer having a first mixer input, a first local oscillator input and a first mixer output. The first mixer input is connectable to the main input and the first local oscillator input is connectable to a source providing the first local oscillator signal LO1 having a frequency $\omega_{LO}$ close to or equal to the carrier frequency $\omega_{RF}$. The first standard mixer performs a multiplication of the input signal $S_{RF}(t)$ and the first local oscillator signal LO1 in order to provide a first output signal $S_A(t)$ at the first mixer output. It further comprises a second standard mixer having a second mixer input, a second local oscillator input, and a second mixer output. The second mixer input is connectable to the main input and the second local oscillator input is connectable to a source that provides a second local oscillator signal LO2 with the frequency $n\omega_{LO}$. The second standard mixer performs a multiplication of the input signal $S_{RF}(t)$ and the second local oscillator signal LO2 in order to provide a second output signal $S_B(t)$ at the second mixer output B. The mixer further comprises means for weighting the second output signal $S_B(t)$ with a coefficient $-\frac{1}{3}$ in order to provide a weighted second output signal. An adder is provided that performs an addition of the first output signal $S_A(t)$ and the weighted second output signal $-\frac{1}{3} S_B(t)$.

The first local oscillator signal LO1 and the second local oscillator signal LO2 are square waves.

Figure 5:
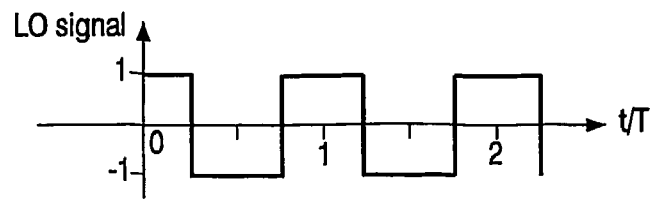
FIG. 5 is a diagram depicting another square-wave LO signal, as used in connection with mixers according to the present invention.

Yet another mixer 60, according to the present invention, is now described in connection with FIG. 5, FIG. 6A and FIG. 6B. The mixer 60 is referred to as quadrature mixer, as will be explained in the following paragraphs.

In modern communication, quadrature mixers are extensively used to down-convert frequency or phase-modulated signals. A quadrature mixer comprises two identical standard mixers (also known as in-phase channel or I-channel and quadrature-channel or Q-channel), the phases of the two LO signals being in quadrature. To reduce the noise, again both LO signals have to be square-wave signals with 50% duty cycle. A square wave signal that is in quadrature to that in FIG. 3 is shown in FIG. 5. Similarly, the Fourier series of this waveform is given by the following equation:

$$S_{LO}(t) = \frac{4}{\pi}\left(\cos\omega_{LO}t - \frac{1}{3}\cos3\omega_{LO}t + \frac{1}{5}\cos5\omega_{LO}t - \ldots\right) \quad (10)$$

Comparing the equation (10) with the equation (1), provides that the two equations are the same except that (i) the fundamental and harmonics are cos rather than sin functions, and (ii) that the signs of the 2nd, 4th, 6th, . . . terms are negative. Consequently, a spurious-reject mixer in quadrature to its counterpart in FIG. 4A can be obtained by using the LO signals shown in FIG. 6B and simply changing the coefficients of the second standard mixer 62 from $-\frac{1}{3}$ to $+\frac{1}{3}$.

The mixers can either be standard mixers followed by a special unit that applies appropriate coefficients (e.g., $-\frac{1}{3}$ in case of the first embodiment, or $+\frac{1}{3}$ in case of the quadrature embodiment) to the multiplication, or a special mixer can be used where the multiplication of the input signal $S_{RF}(t)$ and the LO signal (e.g., LO1) is performed such that the respective coefficient is applied in this multiplication. In FIGS. 4A and 6A special units 54, 55 and 74, 75 respectively, are depicted that are designed to apply the respective coefficient. It is also conceivable, that the LO signals come with the respective coefficient. In this case, the LO2 signal for example should have a coefficient of $-\frac{1}{3}$.

The mixers used in connection with the present invention provide for a down conversion of the received (RF) input signal. This down conversion is achieved by a multiplication operation where the received (RF) input signal is multiplied by a local oscillator signal (LO). To achieve this mixing function, the local oscillator (LO) signal runs at or near the incoming carrier frequency of the desired band. The difference between the LO signal and input signal frequency results in the intermediate frequency (IF).

According to the present invention, either there are as many single local oscillator sources as there are standard mixers (e.g., three mixers and three LO sources), or there is one generator providing a plurality of oscillator signals to a combination logic. This combination logic combines the plurality of oscillator signals to generate the desired local oscillator signals.

Figure 7:
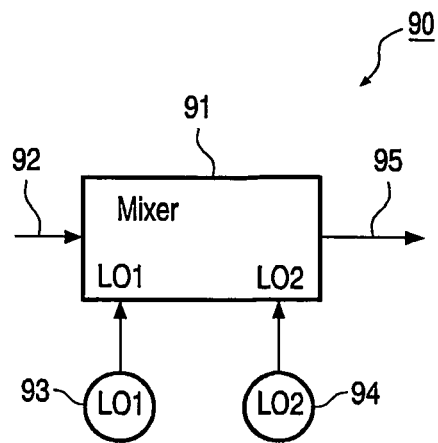
FIG. 7 is a schematic block diagram depicting a third spurious-reject mixer according to the present invention.

One embodiment where two local oscillator sources are used is depicted in FIG. 7. The mixer 90 comprises two standard mixers being part of a unit 91. There are two local oscillators 93 and 94. The first local oscillator 93 outputs a signal LO1 and the second local oscillator 94 outputs a signal LO2, as depicted in FIG. 7 In addition, the mixer 90 has an input 92 for receiving a input signal $S_{RF}(t)$ and an output 95 for providing an output signal.

Figure 8:
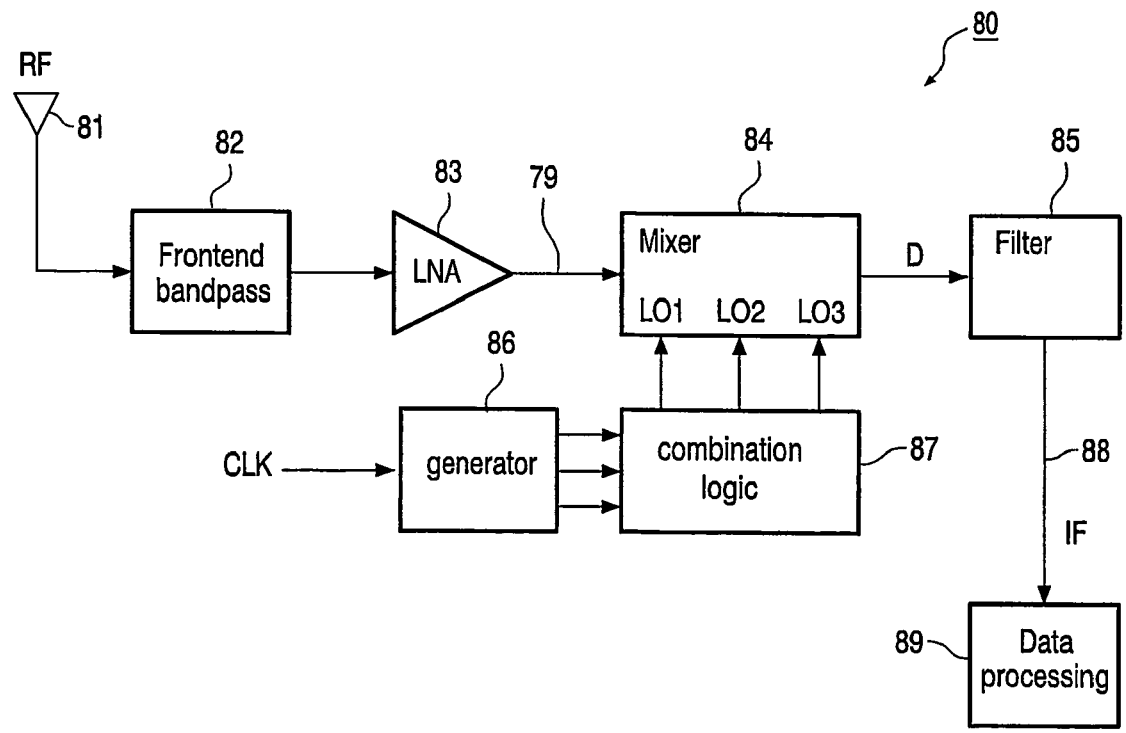
FIG. 8 is a schematic block diagram depicting a receiver according to the present invention.

A radio-frequency signal receiver 80, comprising another arrangement in accordance with the present invention, is depicted in FIG. 8. The receiver 80 comprises a mixer 84, a generator 86 providing a plurality of oscillator signals (in the present example three different oscillator signals are provided, hence there are three connections from the generator 86 to the combination logic 87), and a combination logic 87 to obtain the required LO signals LO1, LO2, and LO3. The receiver 80 further comprises an antenna 81 followed by a front-end bandpass filter 82. This filter 82 may be used to filter unwanted 'image' signals before reaching the mixer 84. The front-end bandpass filter 82 is followed by a low-noise amplifier 83 (LNA) that provides an amplification of the received RF signal. Since the mixer 84 directly follows the low-noise amplifier 83, it very much determines the performance of the overall receiver system 80. At the output D of the mixer 84, a filter 85—e.g., a low-pass filter—may be situated.

A data processing unit 89 may be connected to the output 88 of the filter 85. The data processing unit 89 performs a post processing of the information signal (preferably digital data) that was carried in the desired band received via the antenna 81. The data processing unit 89 may comprise some form of microprocessor or digital signal processing (DSP) engine. The receiver system 80 could be part of the receive path of a GSM, Bluetooth or UMTS cellular telephone, for example.

Figure 1:
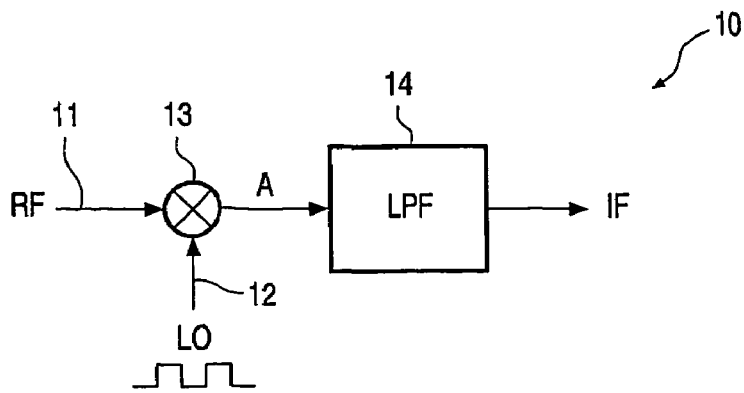
FIG. 1 is a conventional RF mixer.

It has been shown and described in connection with the mixer circuits 40 and 60 of FIGS. 4A and 6A that adding one additional mixer to a conventional mixer gives it the power to reject one more spurious signal due to one harmonic of the LO signal. In general, adding n additional mixers to a conventional mixer of FIG. 1, for example, enables the resultant mixer to reject n spurious signals around a total of n harmonics of the LO signal.

As expected, the resultant mixer becomes more complex as more spurious signals are to be rejected. As the circuit is getting more complex, the proper multipliers may not be found so easily on inspection, as above, but by solving equations. On the other hand, the higher-order harmonics of a square wave have lower amplitudes, and spurious signals at higher frequencies can be sufficiently suppressed by a filter. This calls for a trade-off. Up to which order of the harmonics of the LO signal the spurious signal around depends on the application and the specific situation.

Figure 6A:
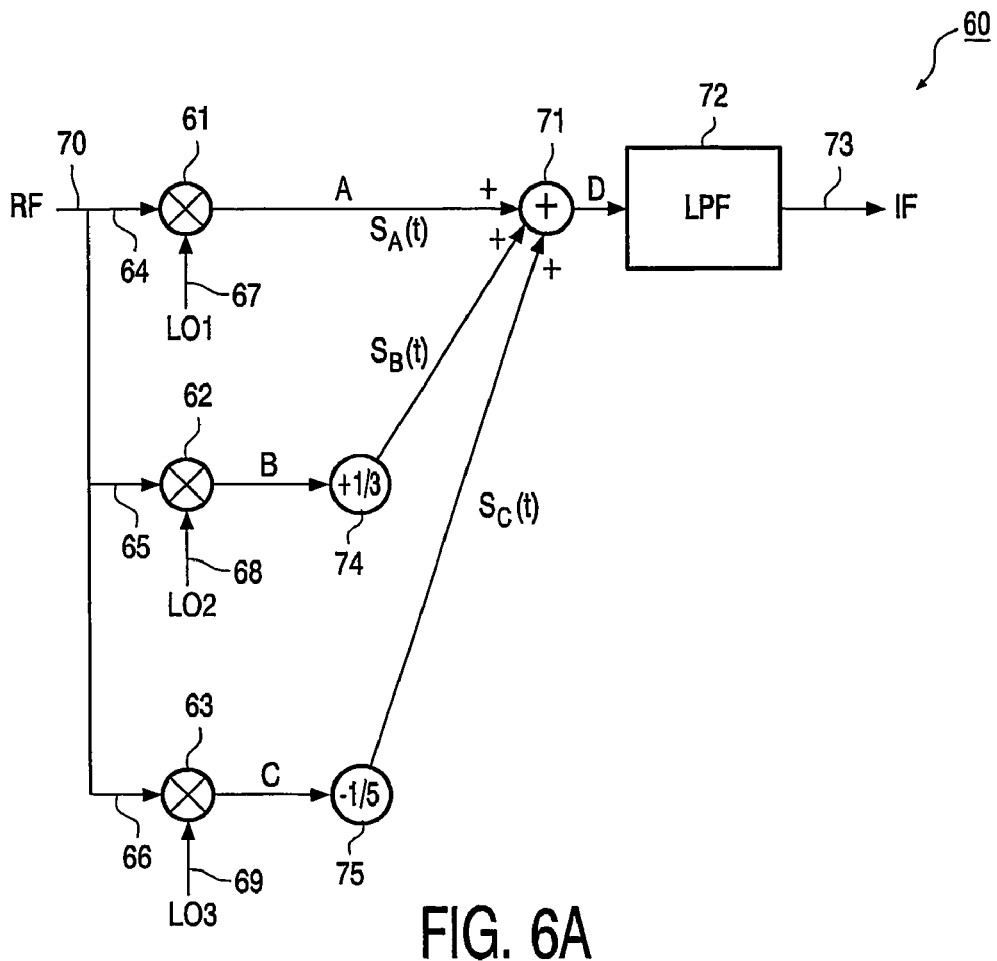
FIG. 6A is a schematic block diagram depicting a second spurious-reject mixer according to the present invention.
Figure 6B:
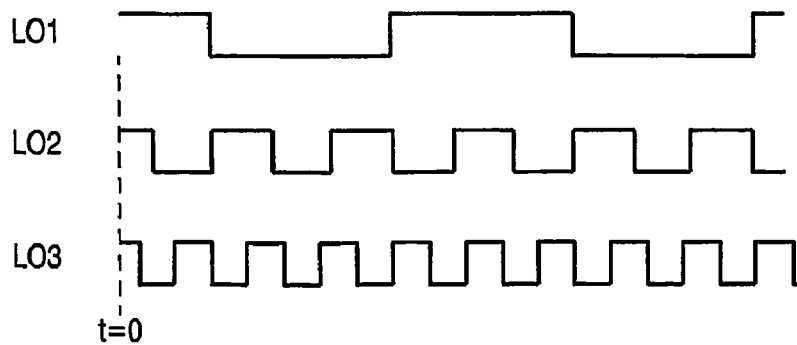
FIG. 6B is a diagram depicting three square-wave LO signals, as used in connection with a mixer of FIG. 6A.

Nevertheless, it is deemed that the mixer embodiments in FIGS. 4A and 6A are reasonable and adequate for most applications. This is for at least two reasons: First, the cross-product falling in the IF band due to the n-th harmonic of the LO signal is inversely proportional to n. Secondly, a bandpass or low-pass filter can provide more attenuation to a signal as its frequency departs further from the center frequency of the bandpass filter, or the corner frequency of a low-pass filter. Like the spurious signals, the input noise spectra within the IF band at the odd harmonics of the LO signals fall in the forbidden band after mixing. Fortunately, they can also be rejected by the inventive spurious-reject mixers.

It is an advantage of the present invention, that the mixers can easily be implemented as integrated circuits. They can thus be relatively inexpensive to manufacture. CMOS technology is well-suited for this purpose. The inventive concept can be applied to fully-integrated CMOS receivers, for example. Bipolar transistors, however, can be used as well.

The present invention can be applied to heterodyne radio-frequency receivers. Mixers of the variety to which the present invention pertains, have many potential practical applications, including integrated circuits and modules for radio frequency receivers, and other wireless communications products. They are, for instance, employed in single side-band mixers and quadrature demodulators and modulators.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable sub-combination.

In the drawings and specification preferred embodiments of the invention have been set forth and, although specific terms are used, the description thus given uses terminology in a generic and descriptive sense only and not for the purpose of limitation.

The invention claimed is:

1. Apparatus for processing an input signal having a carrier frequency that defines a desired band and at least a side band having a side band frequency that is higher than the carrier frequency, the apparatus comprising a main input for receiving said input signal, a first mixer having a first mixer input, a first local oscillator input, and a first mixer output, the first mixer input being connectable to the main input and the first local oscillator input being connectable to a source providing a first local oscillator signal having a frequency close to or equal to the carrier frequency, the first mixer performing a multiplication of said input signal and said first local oscillator signal to provide a first output signal at the, first mixer output, the apparatus further comprising at least a second mixer having a second mixer input, a second local oscillator input, and a second mixer output, the second mixer input being connectable to the main input and the second local oscillator input being connectable to a source providing a second local oscillator signal having the side-band frequency, the second mixer performing a multiplication of said input signal and said second local oscillator signal to provide a second output signal at the second mixer output, means for performing a superpositioning of the first output signal and the second output signal-whereby an undesired component of the first output signal is partially or wholly cancelled, the first local oscillator signal and the second local oscillator signal being square wave signals.

2. Apparatus as claimed in claim 1, wherein the second mixer applies a negative or a positive coefficient when performing the multiplication of said input signal and said second local oscillator signal.

3. Apparatus as claimed in claim 1, wherein the means for performing a superpositioning of the first output signal and the second output signal are realized as an adder.

4. Apparatus as claimed in claim 1, wherein the desired band carries an information signal, preferably digital data, modulated on the carrier signal with the carrier frequency.

5. Apparatus as claimed in one of the preceding claims, wherein the side band frequency is an odd harmonic of the carrier frequency.

6. Apparatus as claimed in claim 1, further comprising a low-pass filter at the output side of the apparatus.

7. Apparatus as claimed in claim 1, wherein, in order to avoid direct feedthrough, the output of the apparatus is sensed as a differential signal.

8. Apparatus as claimed in claim 1, wherein the period ($T1$) of the first local oscillator signal and the period ($T2$) of the second local oscillator signal have the following relationship:

$$T2=T1/3.$$

9. Apparatus as claimed in claim 1, wherein the first local oscillator signal and the second local oscillator signal have zero phase at $t=0$.

10. Apparatus as claimed in claim 1, wherein the first local oscillator signal and the second local oscillator signal have quadrature phases.

11. Apparatus as claimed in claim 1, wherein the square waves have a 50% duty cycle.

12. Receiver, preferably a heterodyne radio frequency receiver, comprising an apparatus according to claim 1, said apparatus being part of a chain of circuits that processes the input signal to convert it to a low-frequency intermediate-frequency signal.

13. Receiver as claimed in claim 12, being part of a Global System for Mobile communication (GSM) system, a Blue tooth system, or a Universal Mobile Telephony System.

14. Method of processing an input signal having a carrier frequency defining a desired band and at least one sideband frequency defining a sideband, where the sideband frequency is higher than the carrier frequency, the method comprising the steps of: receiving said input signal, providing a first local oscillator signal having a frequency close to or equal to the carrier frequency, performing a multiplication of said input signal with said first local oscillator signal in order to provide a first output signal, providing a second local oscillator signal with the sideband frequency performing a multiplication of said input signal and said second local oscillator signal in order to provide a second output signal, performing a superpositioning of the first output signal and the second output signal whereby an undesired component of the first output signal is partially or wholly cancelled, wherein the first local oscillator signal and the second local oscillator signal are square-wave signals.

15. Method as claimed in claim 14, wherein a negative or a positive coefficient is applied when performing the multiplication of said input signal and said second local oscillator signal.

16. Method as claimed in claim 14, wherein the superpositioning is performed by means of an adder.

17. Method as claimed in claim 14, wherein the desired band carries an information signal, preferably digital data, modulated on the carrier signal with the carrier frequency.

18. Method as claimed in claim 14, wherein the sideband frequency is an odd harmonic of the carrier frequency.

19. Method as claimed in claim 14, using a low-pass filter at the output side.

20. Method as claimed in claim 14, wherein the output is sensed as a differential signal.

21. Method of claim 14, wherein the period ($T1$) of the first local oscillator signal and the period ($T2$) of the second local oscillator signal have the following relationship:

$$T2\ T1/3.$$

22. Method as claimed in claim 14, wherein the first local oscillator signal and the second local oscillator signal have zero phase at $t=0$.

23. Method as claimed in claim 14, wherein the first local oscillator signal and the second local oscillator signal have quadrature phases.

24. Method as claimed in claim 14, wherein the square waves have a 50% duty cycle.

* * * * *